(12) United States Patent
Nyström

(10) Patent No.: US 12,017,542 B2
(45) Date of Patent: Jun. 25, 2024

(54) SAFETY CIRCUIT FOR A POWER SYSTEM OF A VEHICLE AND METHOD FOR CONTROLLING THE SAFETY CIRCUIT

(71) Applicant: VOLVO TRUCK CORPORATION, Gothenburg (SE)

(72) Inventor: Mats Nyström, Torslanda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 367 days.

(21) Appl. No.: 17/448,444

(22) Filed: Sep. 22, 2021

(65) Prior Publication Data

US 2022/0089031 A1 Mar. 24, 2022

(30) Foreign Application Priority Data

Sep. 24, 2020 (EP) .................................... 20198006

(51) Int. Cl.
*B60L 3/00* (2019.01)
*H03K 3/037* (2006.01)

(52) U.S. Cl.
CPC ............ *B60L 3/0046* (2013.01); *H03K 3/037* (2013.01); *B60L 2240/547* (2013.01); *B60L 2240/549* (2013.01); *B60L 2240/80* (2013.01)

(58) Field of Classification Search
CPC ............ B60L 3/0046; B60L 2240/547; B60L 2240/549; B60L 2240/80; H03K 3/037; H02J 2310/48
See application file for complete search history.

(56) References Cited

U.S. PATENT DOCUMENTS

| 6,462,921 B1 | 10/2002 | Bilac et al. |
| 2009/0073624 A1 | 3/2009 | Scholer et al. |
| 2014/0062180 A1 | 3/2014 | Demmerle et al. |

(Continued)

FOREIGN PATENT DOCUMENTS

| CN | 106799968 A | 6/2017 |
| CN | 109789790 A | 5/2019 |

(Continued)

OTHER PUBLICATIONS

European Search Report dated Mar. 19, 2021 in corresponding European Patent Application No. 20198006.7, 13 pages.

(Continued)

*Primary Examiner* — Kyle J Moody
(74) *Attorney, Agent, or Firm* — Venable LLP; Jeffri A. Kaminski

(57) ABSTRACT

A safety circuit for a power system of a vehicle includes a hazardous voltage interlock loop (HVIL) circuit configured to disconnect a high-voltage energy source from a high-voltage system, the HVIL-circuit comprising a contactor and a HVIL control unit; a current meter arranged to measure a current; a fuse; a switching circuit controlling the contactor of the HVIL-circuit. A safety circuit control unit is connected to the current meter and to the switching circuit for controlling the contactor. The safety circuit control unit is configured to, if the HVIL control unit provides a control signal to the switching circuit to open the contactor, and if the current measurement exceeds a first threshold current value, control the switching circuit to delay the opening of the contactor by a controllable time period.

14 Claims, 3 Drawing Sheets

(56) References Cited

U.S. PATENT DOCUMENTS

| | | | |
|---|---|---|---|
| 2014/0203786 A1* | 7/2014 | Oosawa | B60L 58/21 |
| | | | 320/136 |
| 2015/0021984 A1 | 1/2015 | Yoon et al. | |
| 2015/0197153 A1 | 7/2015 | Luedtke et al. | |
| 2018/0072179 A1 | 3/2018 | Burkman et al. | |
| 2019/0184835 A1 | 6/2019 | Karlsson | |
| 2020/0076218 A1 | 3/2020 | Lopez De Arroyabe | |
| 2022/0278520 A1* | 9/2022 | Boury | H02H 3/05 |

FOREIGN PATENT DOCUMENTS

| | | | |
|---|---|---|---|
| DE | 102018003895 | * | 5/2018 |
| DE | 102018003895 A1 | | 1/2019 |
| JP | 2016082764 | * | 10/2014 |
| JP | 2016082764 A | | 5/2016 |
| WO | 9603018 A1 | | 2/1996 |

OTHER PUBLICATIONS

Chinese Office Action dated Jan. 17, 2024 in corresponding Chinese Patent Application No. 202111078794.X, 22 pages.

\* cited by examiner

SAFETY CIRCUIT FOR A POWER SYSTEM OF A VEHICLE AND METHOD FOR CONTROLLING THE SAFETY CIRCUIT

TECHNICAL FIELD

The invention relates to a safety system in an electrical vehicle. In particular, the invention relates to a system and method for disconnecting a high-voltage power source from a high-voltage system in an electrical vehicle.

The invention is applicable in electrical and hybrid vehicles within the fields of trucks, buses, industrial construction machines and the like. Although the invention will be described with reference to a truck, the invention is not restricted to this particular vehicle, but may also be used in other electric vehicles.

BACKGROUND

In vehicles comprising electrical or hybrid drive systems, it is important to be able to safely disconnect the high-voltage energy source from the other high-voltage vehicle systems, for example for allowing the vehicle to be serviced and repaired in a secure manner. There are typically ways of manually shutting down or otherwise disconnection the high-voltage system. However, due to the potentially great hazards of working with a high-voltage system that has not been properly shut down, back-up systems for ensuring that no high-voltage components are accessible to a user are desirable.

For this purpose, it is common to install a Hazardous Voltage Interlock Loop (HVIL) to de-energize the system when for instance a connector is opened. A HVIL-circuit may also be used to protect persons from arcing when opening a contactor carrying a DC current. The high-voltage system also needs to be protected against overload and this is normally done by opening energy source contactors However, the HVIL-circuit will typically attempt to open the contactor to break the circuit as fast as possible once a control signal to that effect is received. If the current is high, opening the contactor may lead to arcing which may be hazardous to a user and which may damage the contactor, or if the current is very high, the contactor may not open at all. Accordingly, there is a need to further improve the safety of a high-power vehicle system comprising a HVIL-circuit.

SUMMARY

An object of the invention is to provide an improved system for providing safe shut-off of a high-voltage system in a vehicle. In particular, the invention aims improve the safety of a power system for a vehicle comprising a Hazardous Voltage Interlock Loop (HVIL) circuit.

According to a first aspect of the invention, there is provided a safety circuit for a power system of a vehicle. The safety circuit comprises: a hazardous voltage interlock loop (HVIL) circuit configured to disconnect a high-voltage energy source from a high-voltage system, the HVIL-circuit comprising a contactor arranged between the high-voltage energy source and the high-voltage system, and a HVIL control unit; a current meter arranged to measure a current between the high-voltage energy source and the high-voltage system; a fuse arranged between the high-voltage energy source and the high-voltage system; a switching circuit arranged to control the contactor of the HVIL-circuit; and a safety circuit control unit connected to the current meter to receive a current measurement of a current running through the contactor and to the switching circuit for controlling the contactor, wherein the safety circuit control unit is configured to: if the HVIL control unit provides a control signal to the switching circuit to open the contactor, and if the current measurement exceeds a first threshold current value, control the switching circuit to delay the opening of the contactor by a controllable time period.

The power system herein refers to a system for providing electrical power to electrical components of a vehicle. The energy source may be a battery arranged to provide power to an electrical motor for vehicle propulsion, or in the case of a working machine, to an implement of the working machine. The high-voltage system typically operates at voltages over 200V, and often the in the range of 400V to 1000V in order to provide propulsive power for heavy vehicles such as trucks and buses.

The HVIL-circuit is arranged and configured to ensure that the electrical connection between a high-voltage power source and the high-voltage system of vehicle can be controllably and securely broken.

The present invention is based on the realization that a further improvement to the safety of the power system can be achieved by controlling the timing of the opening of the contactor in the HVIL-circuit. In particular, for high current, it may be undesirable to force the contactor to open due to the risk of arcing, and for currents far exceeding the normal operating currents of the contactor, it may even be impossible to open the contactor. It should also be noted that the contactor is typically able to conduct currents without taking damage, while trying to open the contactor at that same current may cause arcing and/or damage to the contactor. Thereby, depending on the amplitude of the current, the delay in opening the contactor may provide sufficient time for the fuse to break, thereby protecting the contactor and also an operator of the vehicle.

The first threshold current value is typically higher than a nominal operating value of the power system, i.e. higher than a current provided by the battery during normal operation of the vehicle. Moreover, according to one embodiment of the invention, the controllable time period is based on an amplitude of the measured current. If the amplitude of the measured current is only slightly higher than a nominal operating current, this may be indicative of a fault in the power system which is not a safety concern. In such circumstances, the controllable time period may be sufficiently long to allow the operator to safely stop and park the vehicle is the fault is detected drive driving of the vehicle.

On the other hand, if the measured current exceeds a nominal operating current by an amount so that there is risk of damaging the contactor or other components, the time period is set to be only sufficiently long to allow the fuse to break, thereby breaking the electrical connection between the power source and the high-voltage system. After the fuse has broken, the contactor can be securely opened to secure the disconnection of the power source, but the fuse would obviously have to be replaced or reset.

According to one embodiment of the invention, the fuse is configured to break an electric path between high-voltage energy source and the high-voltage system if the current through the contactor is higher than a safe disconnection current for the contactor. The safe disconnection current of the contactor is here defined as the current for which the contactor can open safely without the risk of damage to the contactor, and may in an example system be approximately 2000 A. Accordingly, the fuse may be configured to protect the contactor so that the fuse breaks for currents higher than the safe disconnection current. However, the fuse may alternatively be configured to break at a current which is higher than the safe disconnection current only if the current remains above the safe disconnection current for a certain time period. The fuse may thus be a time delay fuse which does not break for short current spikes, but which breaks of the elevated current is maintained for a period of time. Moreover, the first threshold current value triggering the delay of the contactor opening may be set to be the same as the safe disconnection current, or it may be set higher. Accordingly, the described safety circuit is designed, and the first threshold current value and the controllable time periods are configured taking the properties of the fuse and contactor into account in order to achieve a safety circuit having the desired properties.

According to one embodiment of the invention, the controllable time period is based on properties of the fuse. The controllable time period may for example be longer than a time required for the fuse to break at the measured current.

According to one embodiment of the invention, the controllable time period may be inversely proportional to the measured current, meaning that the time period is decreasing with an increasing current.

According to one embodiment of the invention the switching circuit is a bi-stable circuit. This means that once the switching circuit is in a certain position, i.e. open or closed, it Will not change even of the supply power is shut down. It will only change position if a corresponding control signal is provided to the switching circuit, thereby ensuring that the connection between the power source and power system is not accidentally closed. The switching circuit may thus be a flip-flop circuit, such as an SR flip flop, as shown in FIG. 4.

There is also provided a power system for a vehicle comprising: a high-voltage energy source; a high-voltage system; and a safety circuit according to any one of the preceding embodiments, and a vehicle comprising such a safety circuit and power system.

According to a second aspect of the invention, there is provided a method for controlling a safety circuit for a power system of a vehicle. The safety circuit comprises a hazardous voltage interlock loop (HVIL) circuit configured to disconnect a high-voltage energy source from a high-voltage system, the HVIL-circuit comprising a contactor arranged between the high-voltage energy source and the high-voltage system, and a HVIL control unit; a current meter arranged between the high-voltage energy source and the high-voltage system; a fuse arranged between the high-voltage energy source and the high-voltage system; a switching circuit arranged to control the contactor of the HVIL-circuit; and a safety circuit control unit. The method comprises: by the current meter, measuring a current between the high-voltage energy source and the high-voltage system; detecting that the HVIL control unit provides a control signal to the switching circuit to open the contactor; comparing (204) the measured current with a current threshold value; and if the measured current exceeds the threshold value, controlling the switching circuit to delay the opening of the contactor by a controllable time period.

There is also provided a control unit arranged and configured to perform the above described method for controlling the safety circuit.

Effects and features of this second aspect of the present invention are largely analogous to those described above in connection with the first aspect of the invention.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the Drawings.

DETAILED DESCRIPTION OF EXAMPLE EMBODIMENTS OF THE INVENTION

In the present detailed description, various embodiments of a safety circuit for a power system according to the present invention are mainly discussed with reference to a power system in a truck. It should however be noted that this by no means limits the scope of the present invention since the described invention is equally applicable in other types of vehicles such as cars, buses and construction vehicles. The described safety circuit may also be used in marine applications such as boats and ships, and in other applications comprising a high-voltage power source and a high-voltage system.

Figure 1:
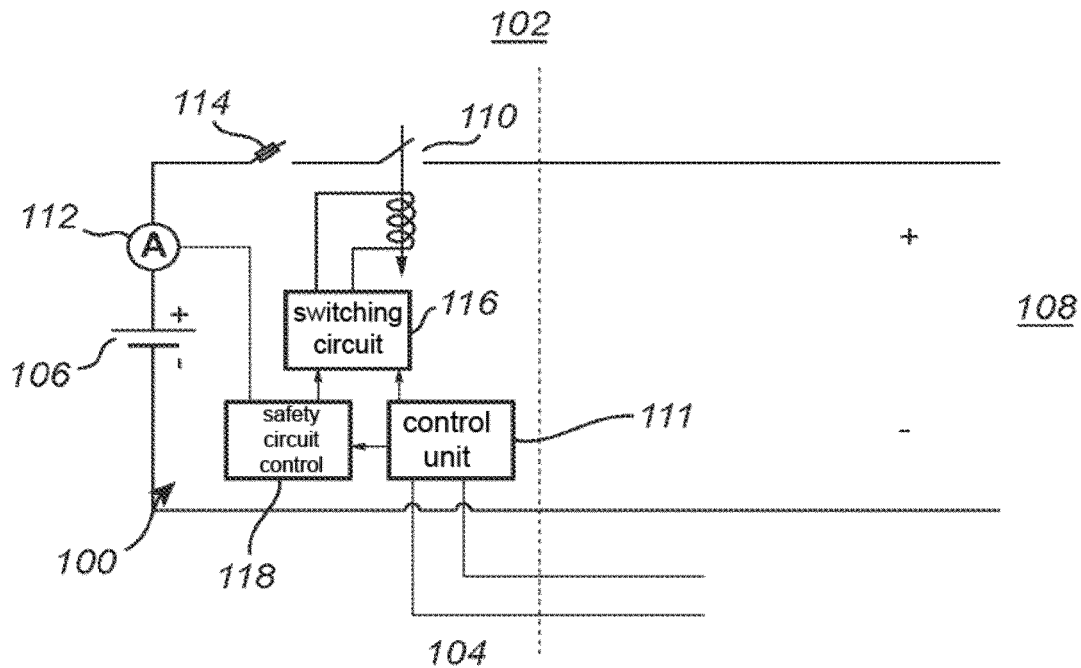
FIG. 1 is a schematic illustration of safety circuit in a power system according to an embodiment of the invention.

FIG. 1 schematically illustrates a circuit schematic of a safety circuit 100 and a power system 102 of a vehicle 300. The safety circuit comprises a hazardous voltage interlock loop HVIL circuit 104 configured to disconnect a high-voltage energy source 106 from a high-voltage system 108. The high-voltage energy source 106 is here illustrated as a battery and the high-voltage system 108 may be an electrical propulsion system of the vehicle.

The HVIL-circuit in turn comprises a contactor 110 arranged between the high-voltage energy source 106 and the high-voltage system 108, and a HVIL control unit 111. In principle, the HVIL-circuit is configured to detect an electrical fault in the power system and to subsequently shut down the system. A typical HVIL circuit consist of a current source, a physical output pin, a return signal pin, here provided by the HVIL control unit 111, and a measurement device and control unit 111 that can detect if the loop is closed. When a current source is used, the monitoring device will know what current to expect from a closed loop, hence a very high degree of reliability can be obtained and a deviation in the current provided by the current source can be detected, resulting in that the contactor 110 is opened. The use of a HVIL-circuit in high-voltage vehicle systems is known to the skilled person and will therefore not be described in further detail herein.

The safety circuit 100 further comprises a current meter 112 arranged to measure a current between the high-voltage energy source 106 and the high-voltage system 108, a fuse 114 arranged between the high-voltage energy source 106 and the high-voltage system 108, a switching circuit 116 arranged to control the contactor 110 of the HVIL-30 circuit; and a safety circuit control unit 118 connected to the current meter 112 to receive a current measurement of a current running through the contactor and to the switching circuit 116 for controlling the contactor 110. The current measurement is here received from the current meter 112. A current meter 112 is commonly present in a power system for a vehicle in order to monitor a current to or from a battery. The current meter 112 is advantageously capable of measuring the high currents which may occur during electrical faults.

Each of the safety circuit control unit 118 and the HVIL control unit 111 may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device.

The safety circuit control unit 118 is configured to detect if the HVIL control unit 111 provides a control signal to the switching circuit 116 to open the contactor 110, and if the current measurement exceeds a first threshold current value, to control the switching circuit 116 to delay the opening of the contactor 110 by a controllable time period. The HVIL-control circuit 111 is thereby blocked from controlling the switching circuit 116 and is consequently blocked from controlling the contactor 110. The safety circuit control unit 118 will allow the contactor to be opened after the controllable time period has passed.

The controllable time period may be set to take on a limited number of fixed and predetermined values where the value to select is based on the measured current for a given configuration of fuse and contactor.

In a practical example, a nominal rating of the fuse may be 150 A, meaning that 150 A can flow uninterrupted though the fuse for thousands of hours. To provide robustness to the fuse a certain margin to the current can be designed. A typical performance of a 150 A fuse may be:

| Fuse current | Trip (pre-arc opening) time |
| --- | --- |
| 200 A | More than 1 h |
| 300 A | 10 s |
| 600 A | 500 ms |
| 1000 A | 200 ms |
| 2000 A | 60 ms |
| 3000 A | 30 ms |
| 5000 A | Less than 10 ms |

An example contactor can safely open at 1000 A but may experience problems with opening and/or arcing at 2000 A, and will fail at 5000 A.

In the above example, when the current is lower than 1000 A the circuit may be opened by the contactor after typically 20-30 ms of continuous fault situation, and when the current is higher than 1000 A the fuse will break the current after a worst-case time of 200 ms.

The above described design makes it possible to have safe interruption of all possible fault currents but still allowing a fast HVIL reaction of less than for instance 30 ms, except in the unlikely situation of HVIL being opened at the same time as having over-current in the power circuit.

The design also means that once the circuit is opened by the HVIL-circuit the vehicle is electrically safe and the power system such as a traction voltage system will not go live until the HVIL loop is closed again.

In FIG. 1, the switching circuit 116 and contactor 110 are illustrated as separate units for clarity. It should be understood that the described functionality of the switching circuit and contactor may also be provided by a single unit.

Moreover, fuse may be configured to break with a few milliseconds for a so called "hard short" giving rise to a current far above a nominal current. For a "soft short" giving rise to a current which is lower but still above a normal operating current, the fuse trigger time may be in the range of several seconds. The described safety circuit thus allows a delayed circuit shut-down at soft short but a fast triggering when arc protection is needed in case of a hard short.

The described delay in opening the contactor 110 can also be used if a fault in HVIL circuit is suspected, i.e. if a signal to open the contactor 110 is provided by the HVIL control unit 111 without an elevated current having been detected. The signal may for example be the result of a fault in the logic or other components of the HVIL-circuit. A delay may allow the operator of the vehicle to stop the vehicle in a secure manner or to take the vehicle to a workshop.

Figure 2:
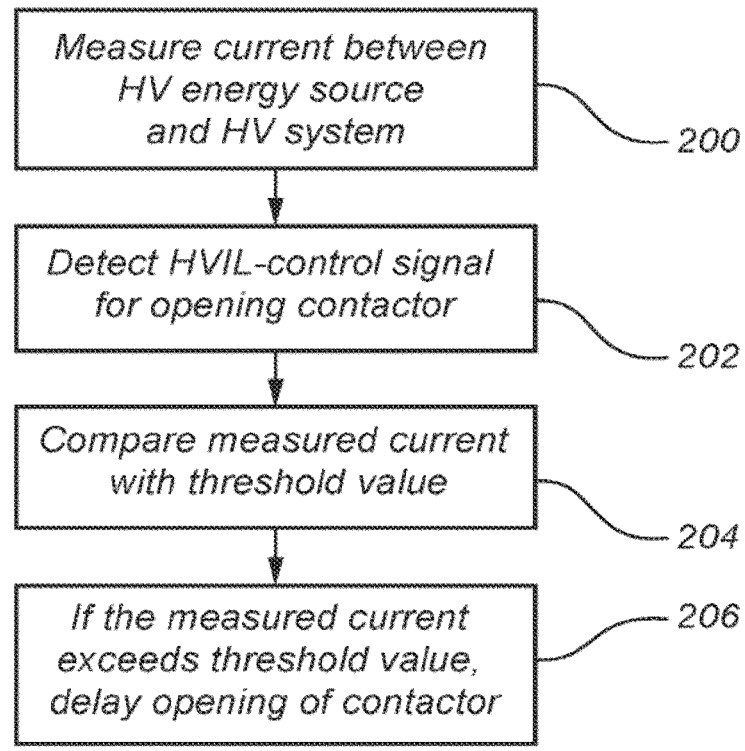
FIG. 2 is a flow-chart outlining a method of controlling a safety circuit in a power system according to an embodiment of the invention.

FIG. 2 is a flow chart outlining the general steps of a method for controlling a safety circuit 100 according to an embodiment of the invention. The method is performed in a safety circuit 100 for a power system 102 of a vehicle according to any of the above described embodiments or examples.

The method comprises: by the current meter 112, measuring 200 a current between the high-voltage (HV) energy source 106 and the high-voltage system 108; detecting 202, by the safety circuit control unit 118, that the HVIL control unit 111 provides a control signal to the switching circuit 116 to open the contactor 110; comparing 204 the measured current with a current threshold value; and if the measured current exceeds the threshold value, controlling 206 the switching circuit 116 to delay the opening of the contactor by a controllable time period. Further features and effects of the method are similar to the ones described above in relation to the functionality of the safety circuit 100.

Figure 3:
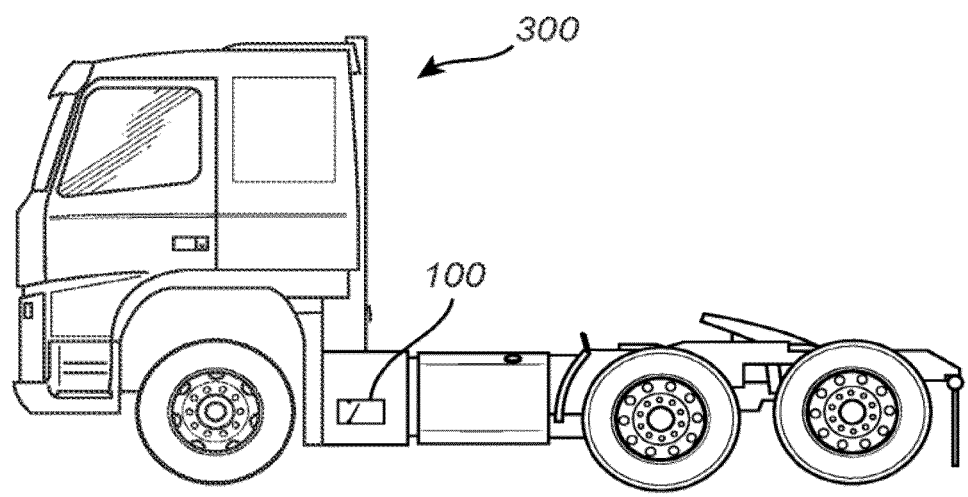
FIG. 3 is a vehicle comprising a power system according to an embodiment of the invention.
Figure 4:
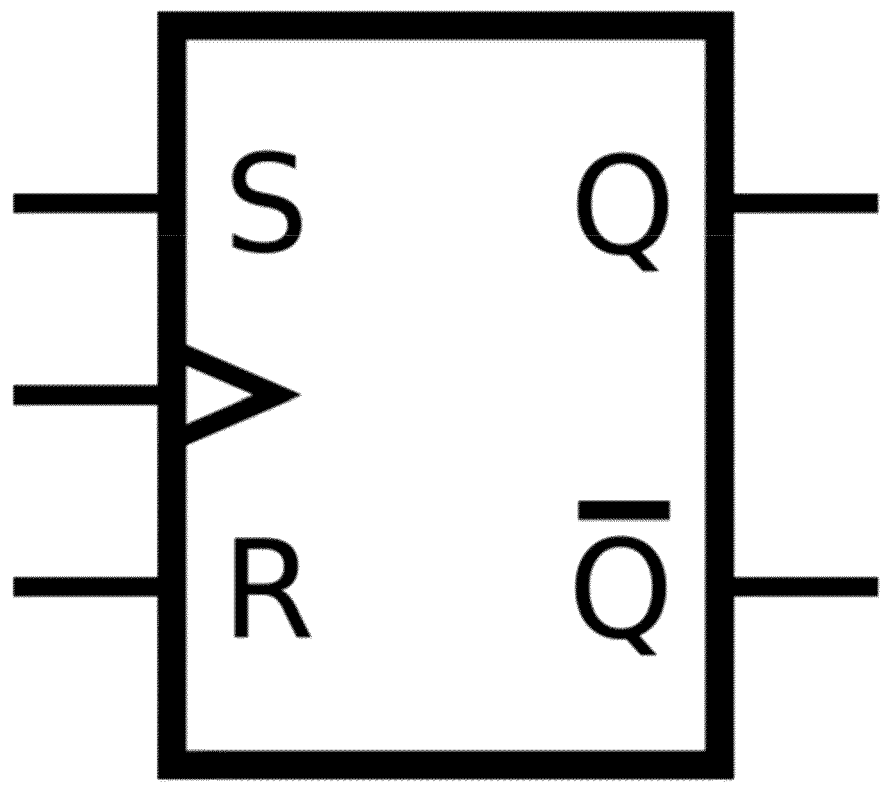
FIG. 4 is a circuit according to an embodiment of the invention.

FIG. 3 is a vehicle 300 comprising a safety circuit 100 for a power system according to any of the aforementioned embodiments and examples.

It is to be understood that the present invention is not limited to the embodiments described above and illustrated in the drawings; rather, the skilled person will recognize that many changes and modifications may be made within the scope of the appended claims.

The invention claimed is:

1. A safety circuit for a power system of a vehicle, the safety circuit comprising:
a hazardous voltage interlock loop circuit configured to disconnect a high-voltage energy source from a high-voltage system, the HVIL-circuit comprising a contactor arranged between the high-voltage energy source and the high-voltage system, and a HVIL control unit;
a current meter arranged to measure a current between the high-voltage energy source and the high-voltage system;
a fuse arranged between the high-voltage energy source and the high-voltage system;
a switching circuit arranged to control the contactor of the HVIL-circuit; and
a safety circuit control unit connected to the current meter to receive a current measurement of a current running through the contactor and to the switching circuit for controlling the contactor, wherein the safety circuit control unit is configured to: if the HVIL control unit provides a control signal to the switching circuit to open the contactor, and if the current measurement exceeds a first threshold current value corresponding to a safe disconnection current for the contactor, control the switching circuit to delay the opening of the contactor by a controllable time period, wherein the controllable time period is based on an amplitude of the measured current.

2. The safety circuit according to claim 1, wherein the fuse is configured to break an electric path between high-voltage energy source and the high-voltage system if the current through the contactor is higher than a safe disconnection current for the contactor.

3. The safety circuit according to claim 2, wherein the contactor is configured to have safe disconnection current of at least 2000 A.

4. The safety circuit according to claim 1, wherein the controllable time period is based on properties of the fuse.

5. The safety circuit according to claim 1, wherein the controllable time period is longer than a time required for the fuse to break at the measured current.

6. The safety circuit according to claim 1, wherein the controllable time period is inversely proportional to the measured current.

7. The safety circuit according to claim 1, wherein the switching circuit is a bi-stable circuit.

8. The safety circuit according to claim 1, wherein the switching circuit is a flip-flop circuit.

9. The power system for a vehicle comprising: the high-voltage energy source; the high-voltage system; and the safety circuit according to claim 1.

10. A vehicle comprising a power system according to claim 9.

11. A method for controlling a safety circuit for a power system of a vehicle, the safety circuit comprising a hazardous voltage interlock loop circuit configured to disconnect a high-voltage energy source from a high-voltage system, the HVIL-circuit comprising a contactor arranged between the high-voltage energy source and the high-voltage system, and a HVIL control unit; a current meter arranged between the high-voltage energy source and the high-voltage system; a fuse arranged between the high-voltage energy source and the high-voltage system; a switching circuit arranged to control the contactor of the HVIL-circuit;

and a safety circuit control unit, the method comprising:
by the current meter, measuring a current between the high-voltage energy source and the high-voltage system;
detecting that the HVIL control unit provides a control signal to the switching circuit to open the contactor;
comparing the measured current with a current threshold value corresponding to a safe disconnection current for the contactor; and
if the measured current exceeds the threshold value, controlling the switching circuit to delay the opening of the contactor by a controllable time period wherein the controllable time period is based on an amplitude of the measured current.

12. The method according to claim 11, wherein the controllable time period is based on an amplitude of the current and on the properties of the fuse such that if the measured current is higher than a safe disconnection current of the contactor, the time period is controlled to be longer than a time required for the fuse to break.

13. The method according to claim 11, further comprising controlling the switching circuit to set the contactor to a stable open position after the controllable time period.

14. A control unit for controlling the safety circuit for the power system of the vehicle, the control unit being configured to perform the steps of the method according to claim 11.

* * * * *